US012663445B2

(12) United States Patent
Hung et al.

(10) Patent No.: US 12,663,445 B2
(45) Date of Patent: Jun. 23, 2026

(54) CURRENT SENSING MODULE, VEHICLE SYSTEM AND METHOD OF PERFORMING CURRENT SENSING AND FAILURE DIAGNOSIS

(71) Applicant: CYNTEC CO., LTD., Hsinchu (TW)

(72) Inventors: Tzu-Hao Hung, Hsinchu (TW); Shu-Wei Hsu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 279 days.

(21) Appl. No.: 18/212,156

(22) Filed: Jun. 20, 2023

(65) Prior Publication Data

US 2023/0417805 A1    Dec. 28, 2023

Related U.S. Application Data

(60) Provisional application No. 63/354,239, filed on Jun. 22, 2022.

(51) Int. Cl.
| | |
|---|---|
| *G01R 19/00* | (2006.01) |
| *G01R 1/20* | (2006.01) |
| *G01R 19/32* | (2006.01) |
| *G01R 31/364* | (2019.01) |

(52) U.S. Cl.
CPC ......... *G01R 19/0092* (2013.01); *G01R 1/203* (2013.01); *G01R 19/32* (2013.01); *G01R 31/364* (2019.01)

(58) Field of Classification Search
CPC .... G01R 19/0092; G01R 1/203; G01R 19/32; G01R 31/364; G01R 31/396; G01R 31/50; B60L 3/0038; B60L 58/10; B60L 58/14; B60L 58/15; B60L 58/22

USPC ........................................................ 324/126
See application file for complete search history.

(56) References Cited

U.S. PATENT DOCUMENTS

| | | | |
|---|---|---|---|
| 9,939,464 B2 | 4/2018 | Wood | |
| 10,545,176 B2 | 1/2020 | Harvey | |
| 2011/0313696 A1 | 12/2011 | Wolf | |
| 2014/0191772 A1* | 7/2014 | Hetzler | .................. G01R 19/10 |
| | | | 324/705 |

(Continued)

FOREIGN PATENT DOCUMENTS

| | | | | |
|---|---|---|---|---|
| CN | 112904255 A | * | 6/2021 | ............. G01R 35/00 |
| CN | 113300032 A | * | 8/2021 | .......... H01M 50/512 |

(Continued)

*Primary Examiner* — Arleen M Vazquez
*Assistant Examiner* — Robert P Alejnikov, Jr.
(74) *Attorney, Agent, or Firm* — Winston Hsu

(57) ABSTRACT

A current sensing module includes a shunt resistor for receiving and sensing a current, a digital sensing circuit, and an analog sensing circuit. The shunt resistor includes a connecting part, a first resistive part and a second resistive part coupled in series to the first resistive part via the connecting part. The digital sensing circuit is coupled to the first resistive part for measuring a first analog voltage of the first resistive part when the current flows through the first resistive part, and providing a first digital measuring value associated with the first analog voltage. The analog sensing circuit is coupled to the second resistive part for measuring a second analog voltage of the second resistive part when the current flows through the second resistive part, and providing a second analog measuring value associated with the second analog voltage.

22 Claims, 6 Drawing Sheets

(56) References Cited

U.S. PATENT DOCUMENTS

2017/0089955 A1* 3/2017 Yugou ................... B60L 3/0038
2017/0307660 A1* 10/2017 Harvey ................. G01R 1/203

FOREIGN PATENT DOCUMENTS

DE      11 2015 004 641 T5     6/2017
DE        102019218308 A1 *   5/2021    ............. G01R 1/203

* cited by examiner

10

10

600

608

CURRENT SENSING MODULE, VEHICLE SYSTEM AND METHOD OF PERFORMING CURRENT SENSING AND FAILURE DIAGNOSIS

CROSS REFERENCE TO RELATED APPLICATIONS

This application claims the benefit of U.S. Provisional Application No. 63/354,239, filed on Jun. 22, 2022. The content of the application is incorporated herein by reference.

BACKGROUND OF THE INVENTION

1. Field of the Invention

The present invention is related to a current sensing module, a vehicle system, and a method of performing current sensing and failure diagnosis, and more particularly, to a current sensing module of a battery, a vehicle system, and a method of performing current sensing and failure diagnosis.

2. Description of the Related Art

Modern electric vehicles typically employ "smart battery" technology which involves a current monitoring unit configured to monitor the current in a precision resistor connected in series with a battery system and an electrical load to monitor the quantity of electrical charge transferred to or from the battery system. For example, an electrical current detection device for measuring a current is configured by a sensor element such as a shunt resistor or a Hall element for estimating a current value from a detection signal of the sensor element. Concretely, the shunt resistor or the Hall element outputs the voltage as a detection signal corresponding to the current, and then the current may be estimated from the detected voltage.

In an electric vehicle, a power supply device equipped with a battery configured by a plurality of battery cells adopts a state monitoring unit for monitoring the state of the battery cells in order to avoid abnormal over-charge or over-discharge in the battery cells. The state monitoring unit typically includes a voltage detection circuit for detecting a voltage in each of the battery cells, a current detection circuit for detecting a charge-discharge current of the battery, and a temperature detection circuit for detecting the ambient temperature or the temperature of the battery. In order to acquire accurate data of the state of the battery cells, it is essential for the current detection circuit to function normally to detect the charge-discharge current of the battery. However, the prior art current sensing module is unable to perform failure diagnosis during current sensing operation.

SUMMARY OF THE INVENTION

An embodiment provides a current sensing module for sensing a current. The current sensing module comprises a shunt resistor for receiving and sensing the current, an analog sensing circuit, and a digital sensing circuit. The shunt resistor comprises a connecting part, a first resistive part, and a second resistive part coupled in series to the first resistive part via the connecting part. The analog sensing circuit is coupled to the second resistive part for measuring a second analog voltage of the second resistive part when the current flows through the second resistive part, and providing a second analog measuring value associated with the second analog voltage. The digital sensing circuit is coupled to the first resistive part for measuring a first analog voltage of the first resistive part when the current flows through the first resistive part, receiving the second analog measuring value from the analog sensing circuit, and providing a first digital measuring value associated with the first analog voltage, and/or a second digital measuring value associated with the second analog voltage. The first digital measuring value, the second analog measuring value and the second digital measuring value vary according to the current.

Another embodiment provides a vehicle system comprising a battery for providing a current and a driving voltage, a charging circuit coupled to the battery for charging the battery, a current sensing module coupled to the battery for sensing the current, a motor coupled to the battery for receiving the driving voltage for driving the vehicle system, and a management system coupled to the charging circuit, the motor and the current sensing module. The current sensing module comprises a shunt resistor for receiving and sensing the current, an analog sensing circuit, and a digital sensing circuit. The shunt resistor comprises a connecting part, a first resistive part, and a second resistive part coupled in series to the first resistive part via the connecting part. The analog sensing circuit is coupled to the second resistive part for measuring a second analog voltage of the second resistive part when the current flows through the second resistive part, and providing a second analog measuring value associated with the second analog voltage. The digital sensing circuit is coupled to the first resistive part and a management system for measuring a first analog voltage of the first resistive part when the current flows through the first resistive part, receiving the second analog measuring value from the analog sensing circuit, and providing a first digital measuring value associated with the first analog voltage, and/or a second digital measuring value associated with the second analog voltage. The motor is coupled to the battery and the management system for receiving the driving voltage for driving the vehicle system. The management system is coupled to the charging circuit, the motor and the current sensing module for monitoring the current based on the first digital measuring value and the second analog measuring value, determining whether the shunt resistor fails based on a relationship between the first digital measuring value and the second analog measuring value, and when the shunt resistor fails, reducing operations of the charging circuit and the motor, and outputting an alarm. The first digital measuring value, the second analog measuring value and the second digital measuring value vary according to the current.

Another embodiment provides a method of performing current sensing and failure diagnosis. The method comprises providing a shunt resistor which includes a connecting part, a first resistive part and a second resistive part coupled in series to the first resistive part via the connecting part, measuring a first analog voltage of the first resistive part when a current flows through the first resistive part using a digital sensing circuit, providing a first digital measuring value associated with the first analog voltage to a management system using the digital sensing circuit, measuring a second analog voltage of the second resistive part when the current flows through the second resistive part using an analog sensing circuit, providing a second analog measuring value associated with the second analog voltage to the management system using the analog sensing circuit, monitoring the current based on the first digital measuring value and the second analog measuring value using the management system, and determining whether the shunt resistor fails based on a relationship between the first digital measuring value and the second analog measuring value.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a current sensing module capable to determine the current capacity of a battery, a battery pack or an array of battery cells (hereafter as the battery) by providing a digital measuring value and an analog measuring value using a shunt resistor which includes two resistive parts. A battery management system, such as a gas gauge circuitry, may be used to predict the current capacity of the battery and determine the functionality of the shunt resistor based on the data provided by the present current sensing module.

Figure 6:
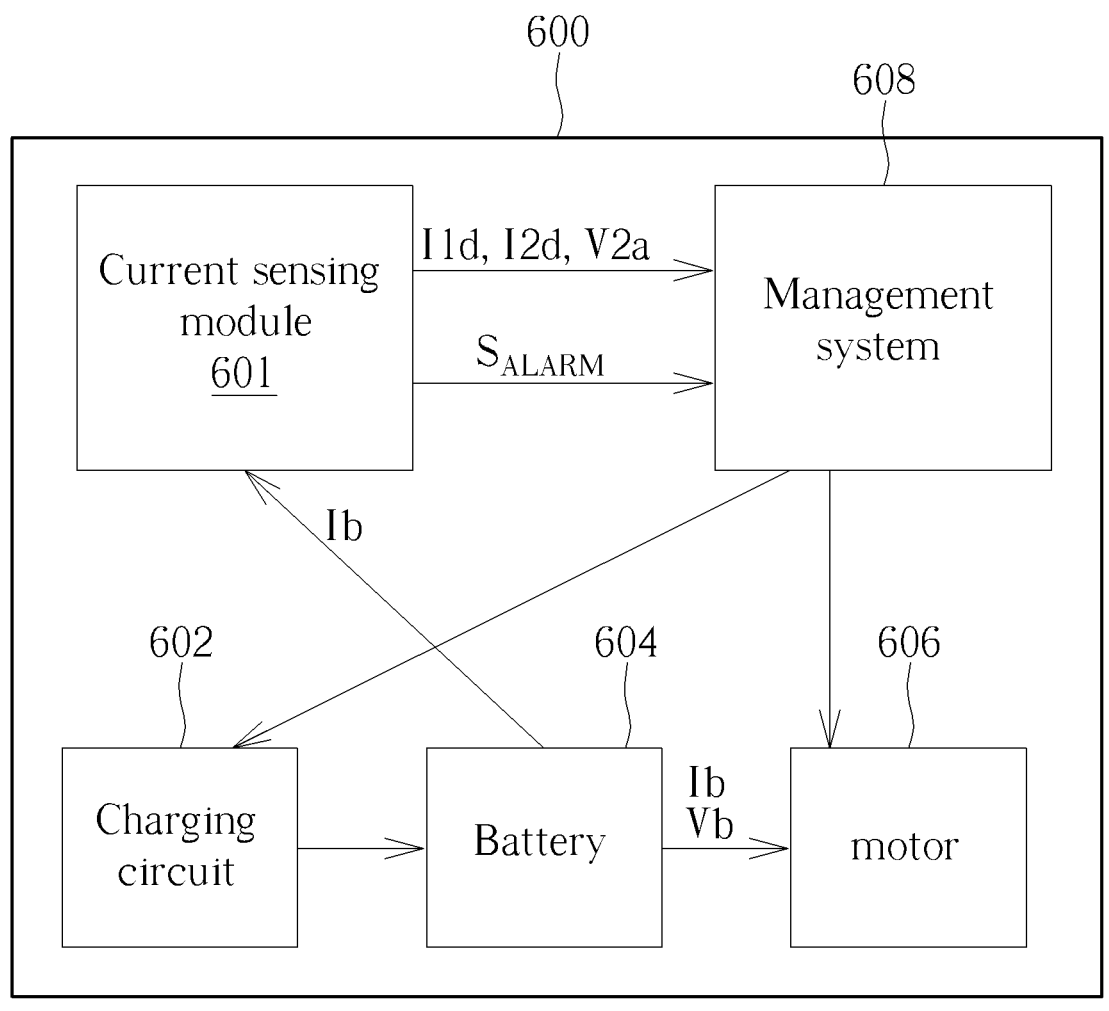
FIG. 6 is a generalized vehicle system according to the present invention.

FIG. 6 is a generalized vehicle system 600 according to an embodiment of the present invention. The vehicle system 600 includes a current sensing module 601, a management system 608, a charging circuit 602, a battery 604, and a motor 606. The current sensing module 601 is coupled to the battery 604 for receiving a current Ib and coupled to the management system 608 for providing a first digital measuring value I1$d$, a second digital measuring value I2$d$ and/or a second analog measuring value V2$a$ to the management system 608. In addition, if the difference between the first digital measuring value I1$d$ and the second digital measuring value I2$d$ is greater than a predetermined percentage, an alarm signal $S_{ALARM}$ will be sent to the management system 608. After receiving the alarm signal $S_{ALARM}$, the management system 608 outputs an alarm to a user and controls the motor 606 and the charging circuit 602 to reduce power levels.

The battery 604 is configured to provide the current Ib and a driving voltage Vb to the motor 606, and provide the current Ib to the current sensing module 601. The charging circuit 602 is coupled to the battery 604 for charging the battery 604. The management system 608 is coupled to the charging circuit 602, the motor 606 and the current sensing module 601 for monitoring the current Ib based on the first digital measuring value I1$d$ and the second analog measuring value V2$a$. The management system 608 determines whether a shunt resistor fails based on a relationship between the first digital measuring value I1$d$ and the second analog measuring value V2$a$. When the shunt resistor 10 fails, the management system 608 reduces operations of the charging circuit 602 and the motor 606 and outputs an alarm. The vehicle system 600 is exemplified by the vehicle systems 610, 620, 630 in FIGS. 1, 2, 3 respectively.

Figure 1:
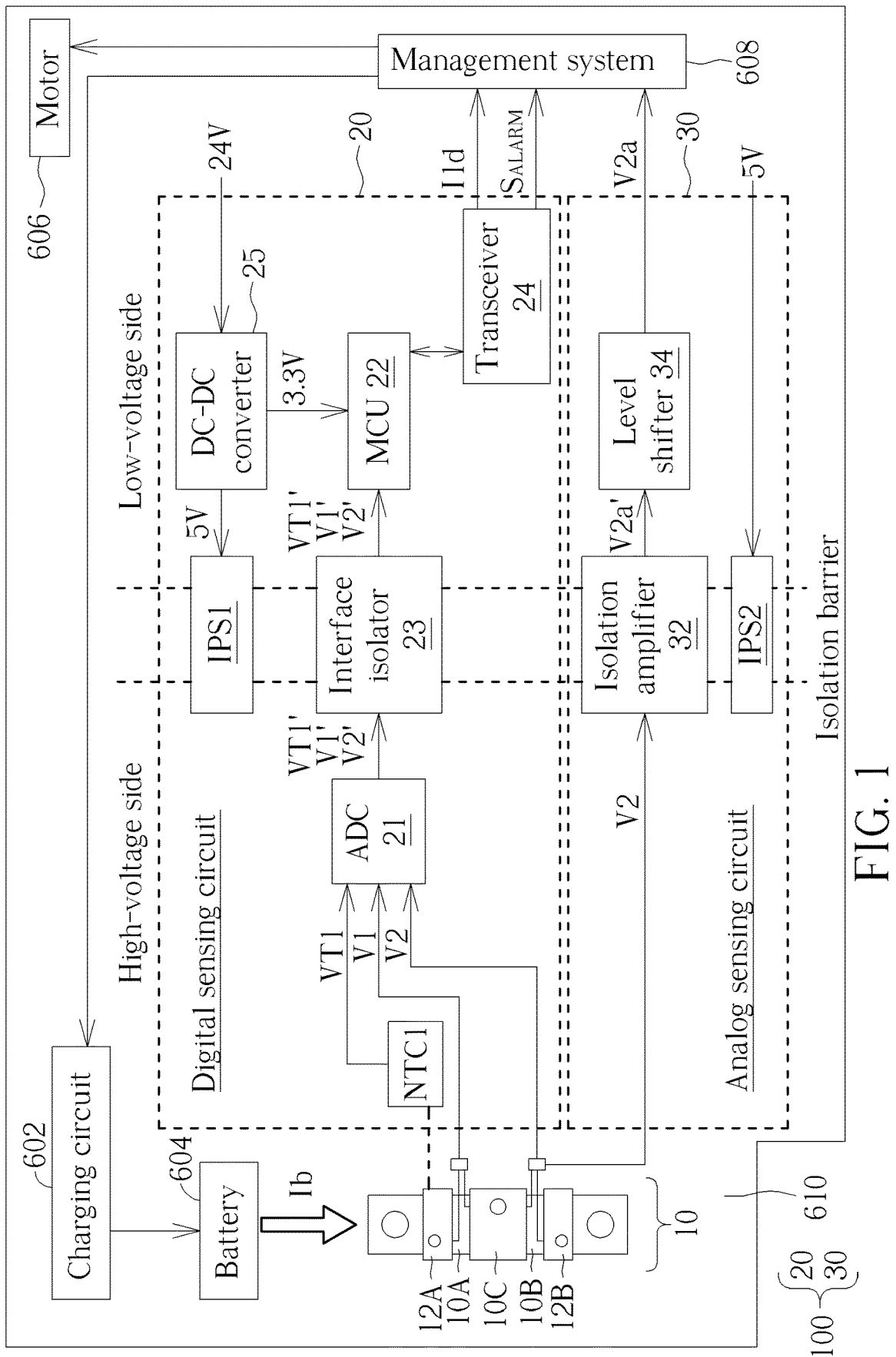
FIG. 1 is a diagram illustrating a vehicle system according to an embodiment of the present invention.
Figure 2:
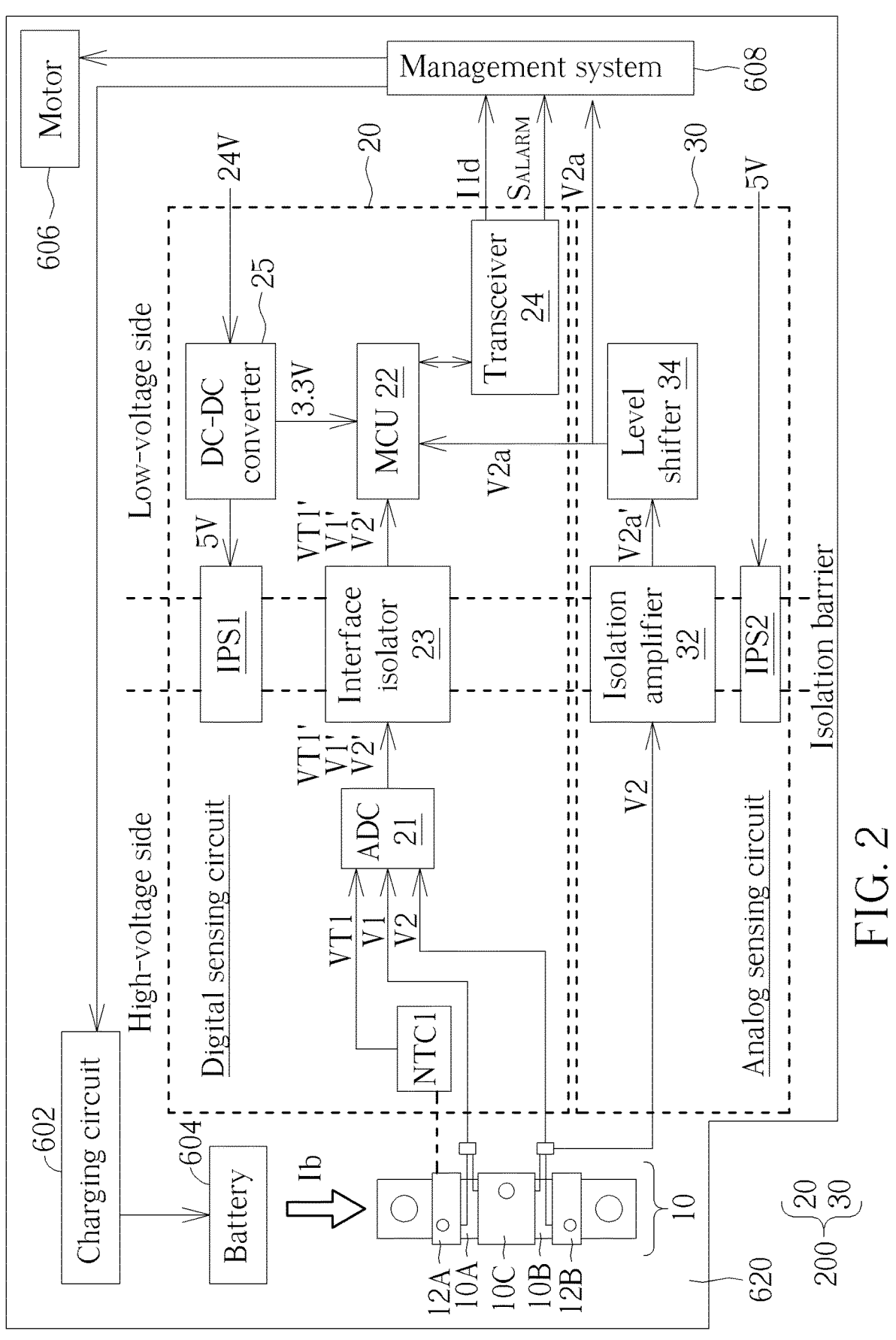
FIG. 2 is a diagram illustrating a vehicle system according to another embodiment of the present invention.
Figure 3:
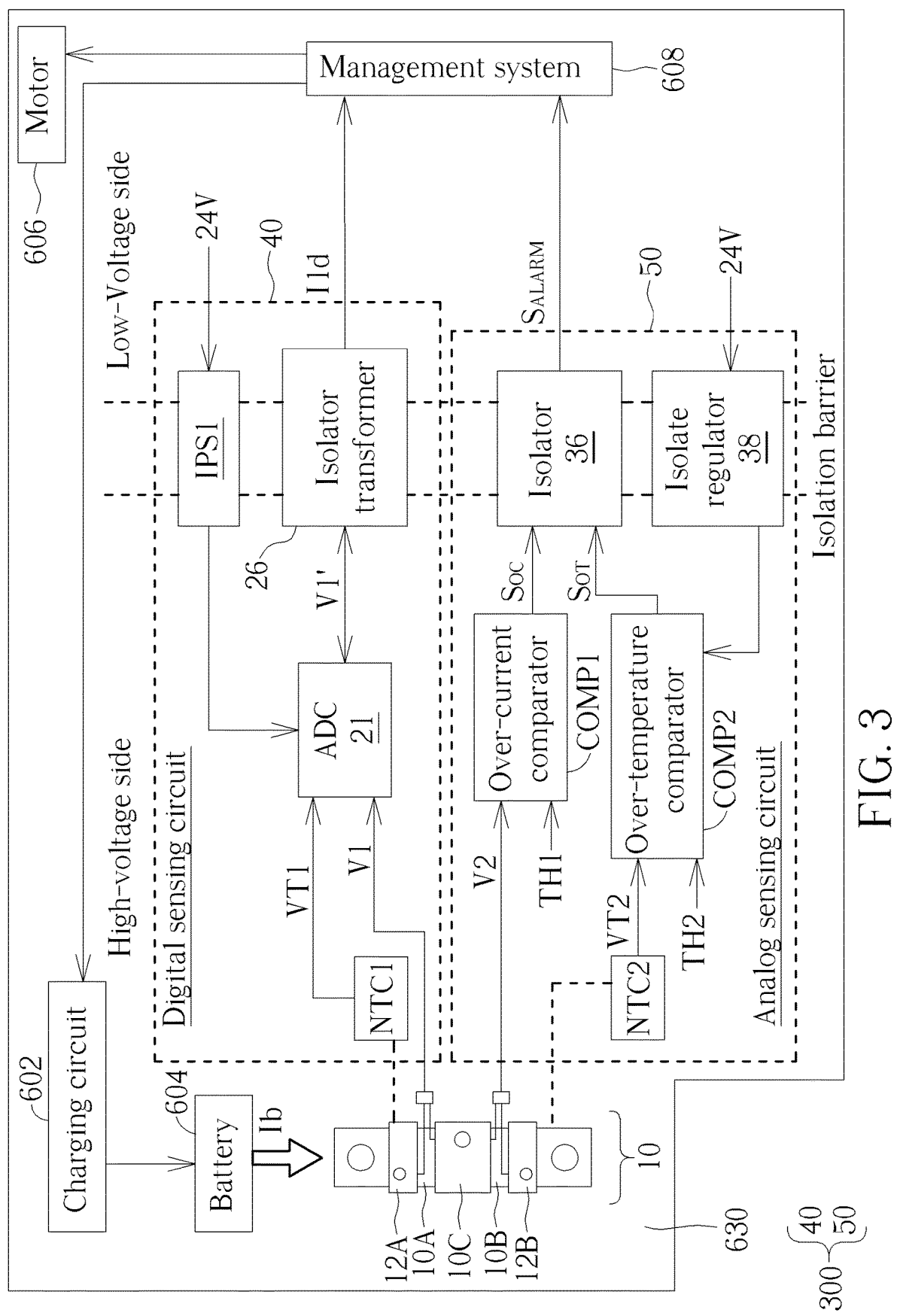
FIG. 3 is a diagram illustrating a vehicle system according to another embodiment of the present invention.

FIG. 1 is a diagram illustrating a vehicle system 610 according to an embodiment of the present invention. FIG. 2 is a diagram illustrating a vehicle system 620 according to another embodiment of the present invention. FIG. 3 is a diagram illustrating a vehicle system 630 according to another embodiment of the present invention. The vehicle systems 610, 620, 630 are different embodiments of the vehicle system 600. The current sensing module 601 in FIG. 6 is represented as current sensing modules 100, 200, 300 in FIGS. 1, 2, 3 respectively. Each of the current sensing modules 100 and 200 in FIGS. 1 and 2 respectively includes a shunt resistor 10, a digital sensing circuit 20 and an analog sensing circuit 30. The current sensing module 300 in FIG. 3 includes a shunt resistor 10, a digital sensing circuit 40 and an analog sensing circuit 50.

The shunt resistor 10 includes a first resistive part 10A, a second resistive part 10B, a connecting part 10C, a first electrode 12A and a second electrode 12B. The first resistive part 10A is coupled in series to the second resistive part 10B via the connecting part 10C. The shunt resistor 10 is configured to receive current Ib of the battery 604 and measure the value of the current Ib. The current Ib may be the charging current or the discharging current of the battery 604. The shunt resistor 10 may be disposed either at a high side (positive) or low side (OV or ground) terminal of the battery 604. As the current Ib sequentially flows through the first electrode 12A, the first resistive part 10A, the connecting part 10C, the second resistive part 10B and the second electrode 12B of the shunt resistor a first analog voltage V1 is established on the first resistive part 10A and a second analog voltage V2 is established on the second resistive part 10B, wherein V1=Ib*R1, V2=Ib*R2, R1 represents the resistance of the first resistive part 10A and R2 represents the resistance of the second resistive part 10B.

In the current sensing module 100 depicted in FIGS. 1 and 2, the digital sensing circuit 20 includes a temperature sensor NTC1, an analog-to-digital converter (ADC) unit 21, a micro control unit (MCU) 22, an interface isolator 23, a transceiver 24, a DC-DC converter 25 and an isolation power supply IPS1. The temperature sensor NTC1 and the ADC unit 21 are disposed on the high-voltage side of the system. The MCU 22, the transceiver 24, and the DC-DC converter are disposed on the low-voltage side of the system. The interface isolator 23 and the isolation power supply IPS1 form an isolation barrier between the high-voltage side and the low-voltage side of the system.

In the current sensing modules 100 and 200 depicted in FIGS. 1 and 2, the temperature sensor NTC1 is configured to provide a first analog temperature measure voltage VT1 associated with the temperature of the first resistive part 10A. In an embodiment, the temperature sensor NTC1 may be disposed on the first resistive part 10A for measuring the actual temperature of the first resistive part 10A. In another embodiment, the temperature sensor NTC1 may be disposed near the first resistive part 10A, such as on the connecting part 10C or on the printed circuit board (PCB) of the digital sensing circuit 20 at a location corresponding to the first resistive part 10A. Under such circumstance, although the temperature sensor NTC1 is not in direct contact with the first resistive part 10A, the first analog temperature measure voltage VT1 provided by the temperature sensor NTC1 is still related to the actual temperature of the first resistive part 10A.

In the current sensing modules 100 and 200 depicted in FIGS. 1 and 2, the ADC unit 21 is coupled to the first temperature sensor NTC1 for receiving the first analog temperature measure voltage VT1 associated with the temperature of the first resistive part 10A, coupled to the first resistive part 10A of the shunt resistor 10 for detecting the first analog voltage V1 of the first resistive part 10A, and coupled to the second resistive part 10B of the shunt resistor 10 for detecting the second analog voltage V2 of the second resistive part 10B. The ADC unit 21 is further configured to convert the first analog voltage V1 into the first digital voltage V1', convert the second analog voltage V2 into the second digital voltage V2', and convert the first analog temperature measure voltage VT1 into a first digital temperature measure voltage VT1'.

The first digital voltage V1', the second digital voltage V2' and the first digital temperature measure voltage VT1' may be transmitted from the ADC unit 21 on the high-voltage side to the MCU 22 on the low-voltage side via the interface isolator 23. In an embodiment, the interface isolator 23 may be a serial peripheral interface (SPI) isolator which allows components to have different ground references and still maintain a communication link, but is not limited thereto.

The MCU 22 is coupled to the ADC unit 21 via the interface isolator 23 for receiving the first digital voltage V1', the second digital voltage V2' and the first digital temperature measure voltage VT1'. The MCU 22 is configured to perform temperature coefficient of resistance (TCR) correction on the resistance R1 of the first resistive part 10A based on the first digital temperature measure voltage VT1' and convert the first digital voltage V1' and the second digital voltage V2' into the first digital measuring value I1$d$ and the second digital measuring value I2$d$ based on the corrected resistance R1 of the first resistive part 10A and second resistive part 10B. The first digital measuring value I1$d$ and the second digital measuring value I2$d$ may be outputted to a management system 608 via the transceiver 24. In an embodiment, the transceiver 24 may be a controller area network (CAN) transceiver, an Ethernet transceiver or a flat panel display link (FPD-link), but is not limited thereto. Based on the first digital measuring current value I1$d$ provided by the digital sensing circuit 20, the management system 608 may accurately monitor the state of the battery 604.

In the current sensing modules 100 and 200 depicted in FIGS. 1 and 2, the analog sensing circuit 30 includes an isolation amplifier 32, a level shifter 34 and an isolation power supply IPS2. The level shifter 34 is disposed on the low-voltage side of the system. The isolation amplifier 32 and the isolation power supply IPS2 forms an isolation barrier between the high-voltage side and the low-voltage side of the system. The isolation amplifier 32 is coupled to the second resistive part 10B of the shunt resistor 10 for detecting the second analog voltage V2 on the low-voltage side and is configured to provide an analog measuring value V2$a$' on the high-voltage side by amplifying the second analog voltage V2. The level shifter 34 is coupled to the isolation amplifier 32 for receiving the analog measuring value V2$a$' and is configured to provide an analog measuring current value V2$a$ by adjusting the level of the analog measuring value V2$a$' so that the analog measuring value V2$a$ is within a suitable range. Based on the second analog measuring current value V2$a$ provided by the analog sensing circuit 30, the management system 608 may accurately monitor the state of the battery 604.

In the present invention, the first digital measuring value I1$d$ provided by the digital sensing circuit 20 may be a digital signal having either a high level (logic 1) or a low level (logic 0). The analog measuring value V2$a$ provided by the analog sensing circuit 30 may be an analog signal whose value represents a voltage range. In the current sensing modules 100 and 200, the digital sensing circuit 20 and the analog sensing circuit 30 are configured to measure current using different methods in order to prevent common-cause failure.

In the current sensing module 100 depicted in FIG. 1, the MCU 22 is further configured to convert the second digital voltage V2' into a second digital measuring value I2$d$ based on the resistance R2 of the second resistive part 10B and acquire the difference between the first digital current value I1$d$ and the second digital current value I2$d$. When the shunt resistor 10 functions normally, the first digital measuring current value I1$d$ and the second digital measuring current value I2$d$ are essentially the same. If the shunt resistor is unable to function normally, the difference between the first digital current value I1$d$ and the second digital current value I2$d$ is greater than a predetermined percentage, such as greater than 20%. Under such circumstance, the MCU 22 is configured to output an alarm signal S$_{ALARM}$ for the management system 608. When the management system 608 receives the alarm signal S$_{ALARM}$ from the current sensing module 100, it indicates that the shunt resistor 10 may fail to function normally for performing accurate current measurement. As a result, the management system 608 may not be able to accurately monitor the state of the battery 604 based on the first digital measuring current value I1$d$ provided by the digital sensing circuit 20 or the analog measuring value V2$a$ provided by the analog sensing circuit 30. In response, the management system 608 may remind the user to perform maintenance or enter secure state, thereby improving product reliability and driving security.

In the current sensing module 200 depicted in FIG. 2, the MCU 22 of the analog sensing circuit 30 is further coupled to the level shifter 34 of the analog sensing circuit 30 for receiving the analog measuring value V2$a$. The MCU 22 is also configured to convert the analog measuring value V2$a$ into a second digital measuring value I2$d$ based on the resistance R2 of the second resistive part 10B and acquire the difference between the first digital current value I1$d$ and the second digital current value I2$d$. When the management system 608 receives the alarm signal S$_{ALARM}$ from the current sensing module 100, 200, it indicates that the shunt resistor 10 may fail to function normally for performing accurate current measurement. As a result, the management system 608 may not be able to accurately monitor the state of the battery 604 based on the first digital measuring current value I1$d$ provided by the digital sensing circuit 20 or the analog measuring value V2$a$ provided by the analog sensing circuit 30. In response, the management system 608 may remind the user to perform maintenance or enter secure state, thereby improving product reliability and driving security.

The first digital measuring value I1$d$ and/or the second digital measuring value I2$d$ are provided to the management system 608 from the digital sensing circuit 20. The second digital measuring value I2$d$ can be obtained from the second digital voltage V2' or the analog measuring value V2$a$ but is not limited thereto. The values of the first digital measuring value I1$d$, the second digital measuring value I2$d$, and the analog measuring value V2$a$ depend on the current Ib. In addition, the corrected resistance R1 of the first resistive part 10A is modified based on the first digital temperature measure voltage VT1' to correctly generate the first digital measuring current value I1$d$.

In an embodiment, the resistance R2 of the second resistive part 10B is greater than the resistance R1 of the first resistive part 10A. Therefore, the gain of the isolation amplifier 32 in the analog sensing circuit 30 can be reduced. In addition, the first resistive part and the second resistive part can be made of different materials to reduce the probability of simultaneous failure.

In the current sensing module 300 depicted in FIG. 3, the digital sensing circuit 40 includes a temperature sensor NTC1, an ADC unit 21, an isolator transformer 26, and an isolation power supply IPS1. The temperature sensor NTC1 and the ADC unit 21 are disposed on the high-voltage side of the system. The isolator transformer 26 and the isolation power supply IPS1 forms an isolation barrier between the high-voltage side and the low-voltage side of the system.

The temperature sensor NTC1 is configured to provide a first analog temperature measure voltage VT1 associated with the temperature of the first resistive part 10A. The ADC unit 21 is coupled to the first temperature sensor NTC1 for detecting the first analog temperature measure voltage VT1 associated with the temperature of the first resistive part 10A and coupled to the first resistive part 10A of the shunt resistor 10 for detecting the first analog voltage V1 of the first resistive part 10A. The ADC unit 21 is configured to convert the first analog voltage V1 into the first digital voltage V1'. The isolator transformer 26 is configured to convert the first digital voltage V1' on the low-voltage side into the first digital measuring value I1$d$ on the high-voltage side. Based on the first digital measuring value I1$d$ provided by the digital sensing circuit 20, the management system 608 may accurately monitor the state of the battery 604.

In the current sensing module 300 depicted in FIG. 3, the analog sensing circuit 50 includes a temperature sensor NTC2, an over-current comparator COMP1, an over-temperature comparator COMP2, an isolator 36, and an isolate regulator 38. The temperature sensor NTC2, the over-current comparator COMP1, and the over-temperature comparator COMP2 are disposed on the high-voltage side of the system. The isolator 36 and the isolate regulator 38 form an isolation barrier between the high-voltage side and the low-voltage side of the system.

The over-current comparator COMP is coupled to the second resistive part 10B of the shunt resistor 10 for receiving the second analog voltage V2 and is configured to provide an over-current signal Soc when the second analog voltage V2 is greater than a first threshold value TH1. The over-temperature comparator COMP2 is coupled to the second temperature sensor NTC2 for receiving the second analog temperature measure voltage VT2 associated with the temperature of the second resistive part 10B and is configured to provide an over-temperature signal SOT when the second analog measure temperature voltage VT2 is greater than a second threshold value TH2.

In the current sensing module 300 depicted in FIG. 3, the isolator 36 is coupled to the over-current comparator COMP1 and the over-temperature comparator COMP2. If the isolator 36 receives the over-current signal Soc from the over-current comparator COMP1 and/or receives the over-temperature signal SOT from the over-temperature comparator COMP2, it indicates that the shunt resistor 10 may fail to function normally for performing accurate current measurement. As a result, the management system 608 may not be able to accurately monitor the state of the battery 604 based on the first digital measuring current value I1$d$ provided by the digital sensing circuit Under such circumstance, the isolator 36 is configured to output an alarm signal S$_{ALARM}$ having a first level (such as a high level) as the analog measuring value V2$a$ for the management system 608. This way, the management system 608 may remind the user to perform maintenance or enter secure state, thereby improving product reliability and driving security.

If the isolator 36 does not receive any of the over-current signal SOC from the over-current comparator COMP1 and the over-temperature signal SOT from the over-temperature comparator COMP2, it indicates that the shunt resistor 10 is able to function normally. Under such circumstance, the isolator 36 is for outputting an alarm signal SALAm having a second level (such as a low level) as the analog measuring value V2$a$ for the management system 608. This way, the management system 608 may monitor the state of the battery 604 based on the first digital measuring current value I1$d$ provided by the digital sensing circuit 20

Figure 4A:
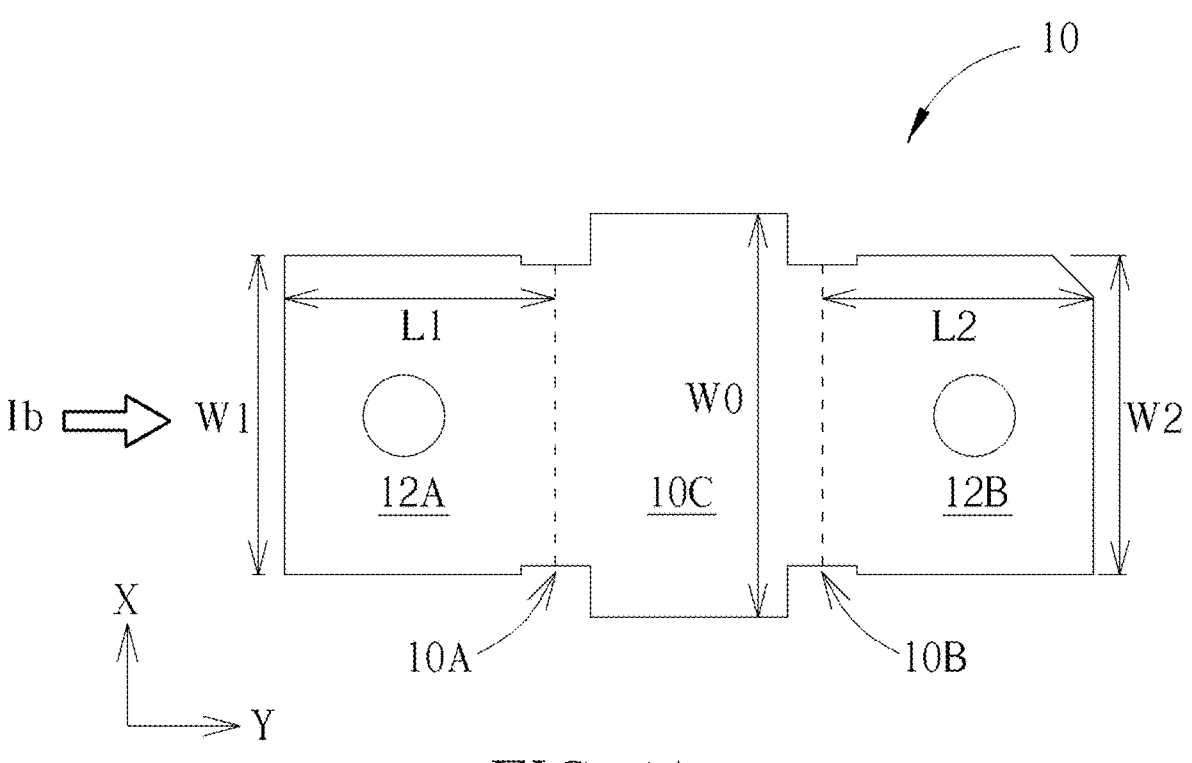
FIG. 4A and FIG. 4B are diagrams illustrating an implementation of a shunt resistor according to an embodiment of the present invention.
Figure 4B:
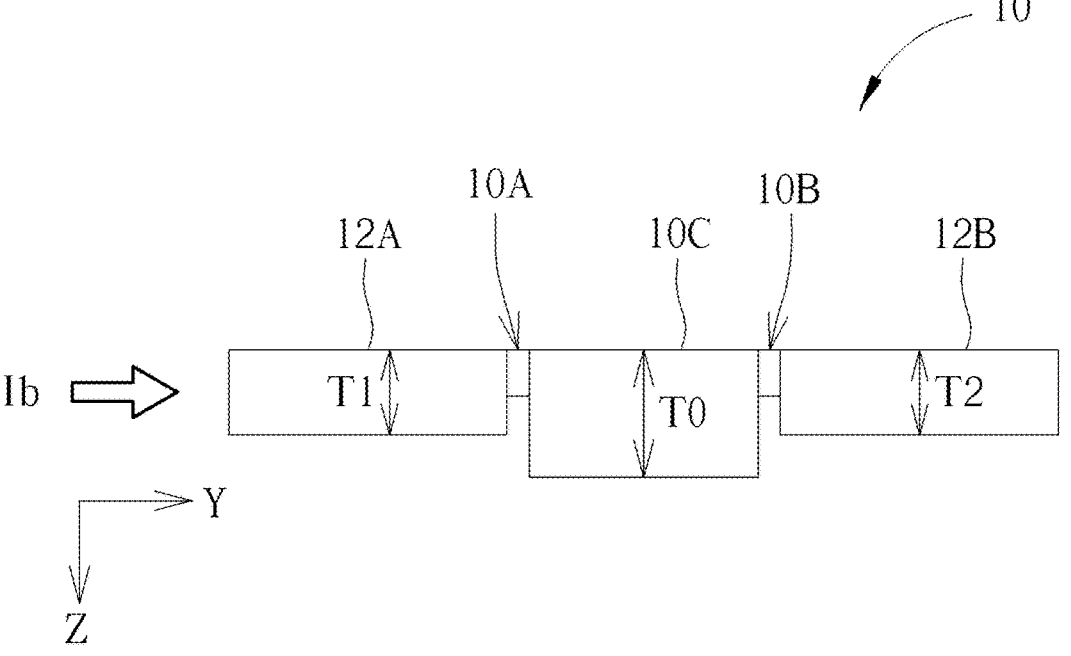
Figure 5A:
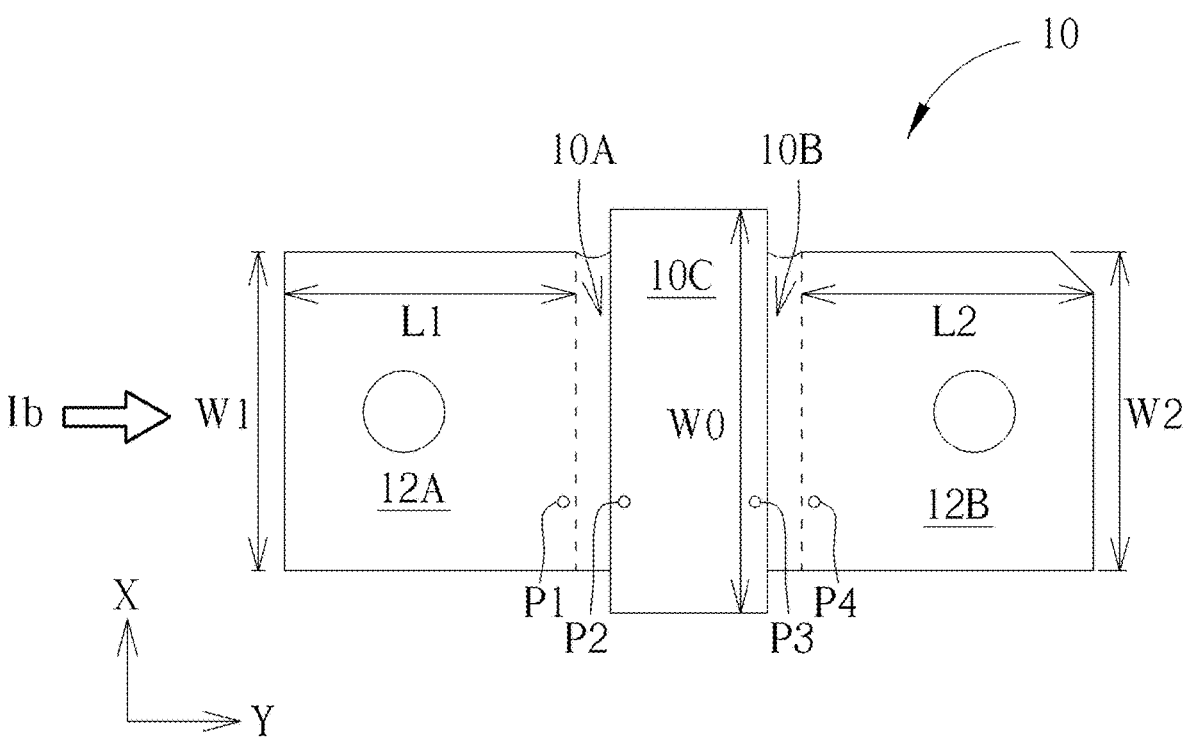
FIG. 5A and FIG. 5B are diagrams illustrating an implementation of a shunt resistor according to another embodiment of the present invention.
Figure 5B:
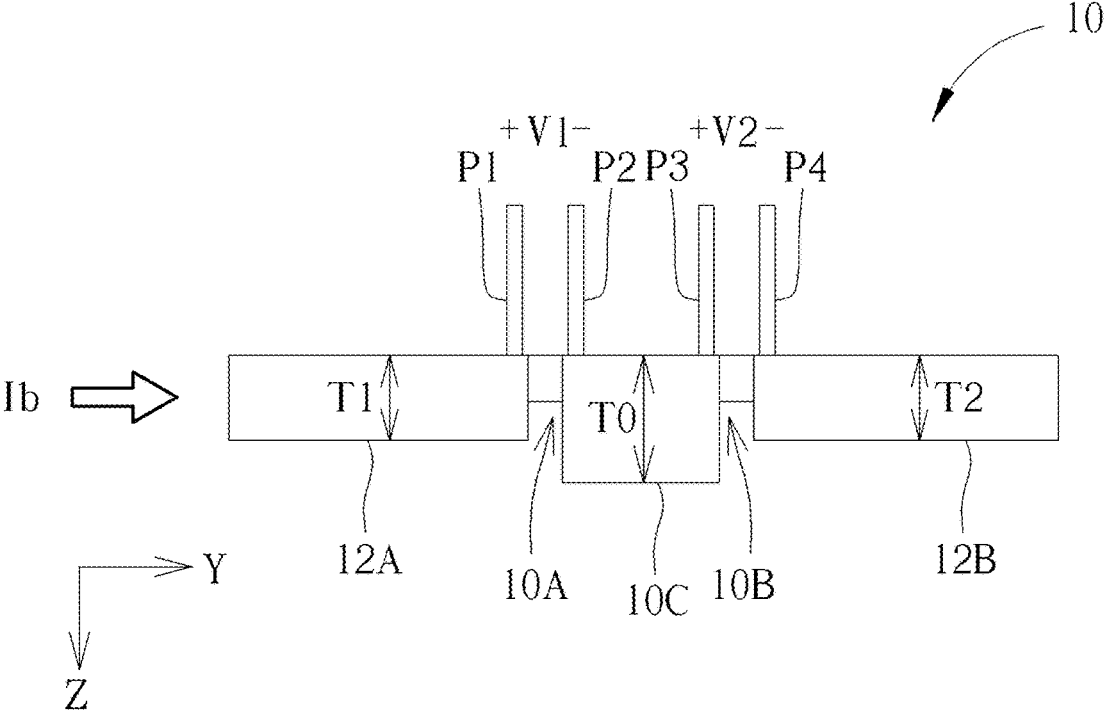

FIGS. 4A and 4B are diagrams illustrating an implementation of the shunt resistor 10 according to an embodiment of the present invention. FIGS. 5A and 5B are diagrams illustrating an implementation of the shunt resistor 10 according to another embodiment of the present invention. FIGS. 4A and 5A depict the top view of the shunt resistor 10 (looking into an X-Y plane), and FIGS. 4B and 5B depict the cross-sectional view of the shunt resistor into a Y-Z plane). For ease of explanation, FIGS. 4A, 4B, and 5B only depict the first resistive part 10A, the second resistive part 10B, and the connecting part 10C of the shunt resistor of the shunt resistor 10. The first resistive part 10A is connected to a first side of the connecting part 10C and the second electrode 12B is connected to a second side of the connecting part 10C, thereby forming a series configuration along the Y-axis along which the current Ib flows. W1 represents the width of the first resistive part along the X-axis, L1 represents the length of the first resistive part 10A along the Y-axis, and T1 represents the thickness of the first resistive part 10A along the Z-axis. W2 represents the width of the second resistive part 10B along the X-axis, L2 represents the length of the second resistive part 10B along the Y-axis, and T2 represents the thickness of the second resistive part 10B along the Z-axis. W0 represents the width of the connecting part 10C along the X-axis, and TO represents the thickness of the connecting part 10C along the Z-axis. The X-axis, the Y-axis and the Z-axis are perpendicular to each other, wherein the direction of the current Ib is perpendicular to the Y-axis.

In an embodiment, the first resistive part 10A and the second resistive part 10B may be made of alloy, and the connecting part 10C may be a metal electrode. As the current Ib flows through the shunt resistor 10 along the Y-axis, the heat generated by the first resistive part 10A and the second resistive part 10B may further increase the temperature of the connecting part 10C and enlarge the temperature difference between both sides of the first resistive part or the second resistive part 10B, thereby causing higher electromotive force (EMF). In the present invention, the connecting part 10C may be wider than the first resistive part 10A and the second resistive part 10B along the Y-axis (W0>W1 and W0>W2) and/or thicker than the first resistive part 10A and the second resistive part 10B along the Z-axis (T0>T1 and T0>T2) for improving heat dissipation, as depicted in FIGS. 4A, 4B, 5A and 5B.

In the embodiment depicted in FIGS. 5A and 5B, a pin P1 is further disposed on the first resistive part 10A and pin P2 is further disposed on the first side of the connecting part 10C for outputting the first analog voltage V1. A pin P3 is further disposed on the second side of the connecting part 10C, and a pin P4 is further disposed on the second resistive part 10A for outputting the second analog voltage V2.

In an embodiment of the present invention, the first resistive part 10A and the second resistive part 10B are directly welded to the connecting part 10C instead of using screws in order to reduce the number of contact points and the overall contact resistance. Based on actual test result, each screw may add contact resistance by around 2.5 uΩ. The present invention can reduce at least two screw contact points by directly welding the first resistive part 10A, the connecting part 10C and the second resistive part 10B in a series configuration, thereby reducing contact resistance by around 5 uΩ. Regarding welding techniques, a specific welding jig may be designed for welding the first resistive part 10A and the second resistive part 10B to the connecting part 10C in order to prevent thermal deformation of weld materials and to ensure the flatness of the weld plate.

In an embodiment of the present invention, the resistance R1 of the first resistive part 10A is different from the resistance R2 of the second resistive part 10B.

In the current sensing modules 100 and 200, the DC-DC converter 25 is configured to convert an external supply voltage into internal supply voltages having various levels for driving different devices. For example, the DC-DC converter 25 may convert a 24V external supply voltage into a 3.3V internal voltage for driving the MCU 22 and into a 5V internal voltage for driving the isolation power supply IPS1.

In conclusion, the present invention provides a current sensing module of a battery and a related method of performing current sensing and failure diagnosis. The present current sensing module includes a digital sensing circuit and an analog sensing circuit which are configured to measure current of a shunt resistor using different methods in order to prevent common-cause failure. Failure diagnosis may be performed on the shunt resistor by separately measuring current from a first resistive part and a second resistive part of the shunt resistor, thereby improving product reliability and driving security.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current sensing module for sensing a current, comprising:
 a shunt resistor for receiving and sensing the current and comprising:
  a connecting part;
  a first resistive part; and
  a second resistive part coupled in series to the first resistive part via the connecting part;
 an analog sensing circuit coupled to the second resistive part and configured to:
  measure a second analog voltage of the second resistive part when the current flows through the second resistive part; and
  provide a second analog measuring value associated with the second analog voltage using a first method; and
 a digital sensing circuit coupled to the first resistive part and configured to:
  measure a first analog voltage of the first resistive part when the current flows through the first resistive part; and
  provide a first digital measuring value associated with the first analog voltage, and/or a second digital measuring value associated with the second analog voltage using a second method;
 wherein the first digital measuring value, the second analog measuring value and the second digital measuring value vary according to the current, the digital sensing circuit and the analog sensing circuit are operated separately, circuit components of the digital sensing circuit and circuit components of the analog sensing circuit are different, the first method and the second method are different, and the second analog measuring value is directly outputted for a management system.

2. The current sensing module of claim 1, wherein a first resistance of the first resistive part is lower than a second resistance of the second resistive part, and the first resistive part and the second resistive part are made of different materials.

3. The current sensing module of claim 1, wherein:
 the first digital measuring value is provided based on a first resistance of the first resistive part and a first digital voltage associated with the first analog voltage;
 the second digital measuring value is provided based on a second resistance of the second resistive part and a second digital voltage associated with the second analog voltage; and
 the digital sensing circuit is further configured to output an alarm signal when a difference between the first digital measuring value and the second digital measuring value is greater than a predetermined percentage.

4. The current sensing module of claim 3, wherein the digital sensing circuit is further configured to compensate the first digital measuring value and/or the first resistance of the first resistive part based on a first analog temperature measure voltage associated with a temperature of the first resistive part.

5. The current sensing module of claim 4, wherein the digital sensing circuit comprises:
 a first temperature sensor disposed on or near the first resistive part and configured to provide the first analog temperature measure voltage associated with the temperature of the first resistive part;
 an analog-to-digital converter (ADC) coupled to the first resistive part and the first temperature sensor, and configured to:
  detect the first analog voltage of the first resistive part and convert the first analog voltage into the first digital voltage;
  detect the second analog voltage of the second resistive part and convert the second analog voltage into the second digital voltage; and
  convert the first analog temperature measure voltage into a first digital temperature measure voltage; and
 a micro control unit (MCU) coupled to the ADC and configured to:
  convert the first digital voltage into the first digital measuring value based on the first resistance of the first resistive part and the first digital temperature measure voltage; and
  convert the second digital voltage into the second digital measuring value based on the second resistance of the second resistive part.

6. The current sensing module of claim 5, further comprising an interface isolator coupled between the ADC and the MCU.

7. The current sensing module of claim 4, wherein the digital sensing circuit comprises:
 a first temperature sensor disposed on or near the first resistive part and configured to provide the first analog temperature measure voltage associated with the temperature of the first resistive part;

an ADC coupled to the first resistive part and the first temperature sensor, and configured to:

detect the first analog voltage of the first resistive part and convert the first analog voltage into the first digital voltage;

detect the second analog voltage of the second resistive part and convert the second analog voltage into the second digital voltage; and convert the first analog temperature measure voltage into a first digital temperature measure voltage; and an MCU coupled to the ADC and configured to:

convert the first digital voltage into the first digital measuring value based on the first resistance of the first resistive part and the first digital temperature measure voltage; and receive the second analog measuring value from the analog sensing circuit; and convert the second analog measuring value into the second digital measuring value based on the second resistance of the second resistive part.

8. The current sensing module of claim 7, further comprising an interface isolator coupled between the ADC and the MCU.

9. The current sensing module of claim 1, wherein the analog sensing circuit comprises:

an isolation amplifier coupled to the second resistive part and configured to detect the second analog voltage of the second resistive part and amplify the second analog voltage; and a level shifter coupled to the isolation amplifier and configured to provide the second analog measuring value by adjusting a level of the amplified second analog voltage.

10. The current sensing module of claim 1, wherein the digital sensing circuit comprises:

an analog-to-digital converter (ADC) coupled to the first resistive part and configured to detect the first analog voltage of the first resistive part and convert the first analog voltage into a first digital voltage; and an isolator transformer configured to transmit the first digital voltage on a high-voltage side to the first digital measuring value on a low-voltage side.

11. The current sensing module of claim 10, wherein the analog sensing circuit comprises:

a second temperature sensor disposed on or near the second resistive part and configured to provide a second analog temperature measure voltage associated with a temperature of the second resistive part;

a first comparator coupled to the second resistive part and configured to detect the second analog voltage of the second resistive part and output an over-current signal when the second analog voltage is greater than a first threshold value;

a second comparator coupled to the second temperature sensor and configured to detect the second analog temperature measure voltage and output an over-temperature signal when the second analog temperature measure voltage is greater than a second threshold value; and an isolator coupled to the first comparator and the second comparator and configured to:

provide an alarm signal having a first level as the second digital measuring value when receiving the over-current signal or the over-temperature signal; and provide the alarm signal having a second level as the second digital measuring value when not receiving any of the over-current signal and the over-temperature signal.

12. The current sensing module of claim 1, wherein:

the first resistive part is welded to a first side of the connecting part;

the second resistive part is welded to a second side of the connecting part opposite to the first side of the connecting part;

the first side and the second side of the connecting part are parallel to a first direction;

the current flows along a second direction; and the first direction is perpendicular to the second direction.

13. The current sensing module of claim 12, wherein a width of the connecting part along the first direction is larger than a width of the first resistive part along the first direction and a width of the second resistive part along the first direction.

14. The current sensing module of claim 12, wherein:

a thickness of the connecting part along a third direction is larger than a thickness of the first resistive part along the third direction and a thickness of the second resistive part along the third direction; and the first direction, the second direction and the third direction are perpendicular to each other.

15. The current sensing module of claim 12, wherein:

a width of the first resistive part along the first direction is different from a width of the second resistive part along the first direction, a length of the first resistive part along the second direction is different from a length of the second resistive part along the second direction, or a thickness of the first resistive part along a third direction is different from a thickness of the second resistive part along the third direction; and the first direction, the second direction and the third direction are perpendicular to each other.

16. A vehicle system comprising:

a battery configured to provide a current and a driving voltage;

a charging circuit coupled to the battery and configured to charge the battery;

a current sensing module coupled to the battery for sensing the current, comprising:

a shunt resistor for receiving and sensing the current and comprising:

a connecting part;

a first resistive part; and a second resistive part coupled in series to the first resistive part via the connecting part;

an analog sensing circuit coupled to the second resistive part, and configured to:

measure a second analog voltage of the second resistive part when the current flows through the second resistive part; and provide a second analog measuring value associated with the second analog voltage using a first method; and a digital sensing circuit coupled to the first resistive part, and configured to:

measure a first analog voltage of the first resistive part when the current flows through the first resistive part;

provide a first digital measuring value associated with the first analog voltage, and/or a second digital measuring value associated with the second analog voltage using a second method;

a motor coupled to the battery, and configured to receive the driving voltage for driving the vehicle system; and a management system coupled to the charging circuit, the motor, and the digital sensing circuit of the current sensing module, and configured to:

monitor the current based on the first digital measuring value and the second analog measuring value;

determine whether the shunt resistor fails based on a relationship between the first digital measuring value and the second analog measuring value; and when the shunt resistor fails, reduce operations of the charging circuit and the motor, and output an alarm;

wherein the first digital measuring value, the second analog measuring value and the second digital measuring value vary according to the current, the digital sensing circuit and the analog sensing circuit are operated separately, circuit components of the digital sensing circuit and circuit components of the analog sensing circuit are different, the first method and the second method are different, and the second analog measuring value is directly outputted for the management system.

17. A method of performing current sensing and failure diagnosis, comprising:

providing a shunt resistor which includes a connecting part, a first resistive part and a second resistive part coupled in series to the first resistive part via the connecting part;

measuring a first analog voltage of the first resistive part when a current flows through the first resistive part using a digital sensing circuit;

providing a first digital measuring value associated with the first analog voltage to a management system by the digital sensing circuit using a first method;

measuring a second analog voltage of the second resistive part when the current flows through the second resistive part using an analog sensing circuit;

providing a second analog measuring value associated with the second analog voltage directly to the management system by the analog sensing circuit using a second method;

monitoring the current based on the first digital measuring value and the second analog measuring value using the management system; and determining whether the shunt resistor fails based on a relationship between the first digital measuring value and the second analog measuring value, wherein:

the digital sensing circuit and the analog sensing circuit are operated separately;

circuit components of the digital sensing circuit and circuit components of the analog sensing circuit are different; and the first method and the second method are different.

18. The method of claim 17, further comprising:

measuring the second analog voltage of the second resistive part when the current flows through the second resistive part using the digital sensing circuit;

acquiring the first digital measuring value based on a first resistance of the first resistive part and a first digital voltage associated with the first analog voltage using the digital sensing circuit;

acquiring a second digital measuring value associated with a second resistance of the second resistive part and the second analog voltage; and outputting an alarm signal to the management system when a difference between the first digital measuring value and the second digital measuring value is greater than a predetermined percentage using the digital sensing circuit.

19. The method of claim 18, wherein the first resistance of the first resistive part is different from the second resistance of the second resistive part.

20. The method of claim 18, further comprising:

compensating the first resistance of the first resistive part using the digital sensing circuit based on a first analog temperature measure voltage associated with a temperature of the first resistive part.

21. The method of claim 17, further comprising:

amplifying the second analog voltage using the analog sensing circuit; and providing the second analog measuring value by adjusting a level of the amplified second analog voltage using the analog sensing circuit.

22. The method of claim 17, further comprising:

determining whether the second analog voltage is greater than a first threshold value using the analog sensing circuit;

determining whether a second analog temperature measure voltage associated with a temperature of the second resistive part is greater than a second threshold value using the analog sensing circuit; and providing the alarm signal having a first level as the second digital measuring value using the analog sensing circuit when determining that the second analog voltage is greater than the first threshold value or the second analog temperature measure voltage is greater than the second threshold value; and providing the alarm signal having a second level as the second digital measuring value using the analog sensing circuit when determining that the second analog voltage is not greater than the first threshold value and the second analog temperature measure voltage is not greater than the second value.

* * * * *